United States Patent [19]
McClure

[11] Patent Number: 5,798,980
[45] Date of Patent: Aug. 25, 1998

[54] PIPELINED CHIP ENABLE CONTROL CIRCUITRY AND METHODOLOGY

[75] Inventor: David Charles McClure, Carrollton, Tex.

[73] Assignee: SGS-Thomson Microelectronics, Inc., Carrollton, Tex.

[21] Appl. No.: 878,612

[22] Filed: Jun. 19, 1997

Related U.S. Application Data

[62] Division of Ser. No. 588,730, Jan. 19, 1996, Pat. No. 5,701,275.

[51] Int. Cl.[6] ........................................ G11K 8/00
[52] U.S. Cl. .................. 365/233; 365/189.05; 365/194; 365/239
[58] Field of Search ........................... 711/169; 365/233, 365/189.05, 194, 230.08, 239, 230.01

[56] References Cited

U.S. PATENT DOCUMENTS

| | | | |
|---|---|---|---|
| 5,013,940 | 5/1991 | Ansel | 326/83 |
| 5,099,148 | 3/1992 | McClure et al. | 326/86 |
| 5,107,465 | 4/1992 | Fung et al. | 365/230.08 |
| 5,111,075 | 5/1992 | Ferry et al. | 326/27 |
| 5,218,239 | 6/1993 | Boomer | 326/58 |
| 5,251,181 | 10/1993 | Toda | 365/230.08 |
| 5,258,952 | 11/1993 | Coker | 365/194 |
| 5,267,197 | 11/1993 | McClure | 365/189.01 |
| 5,267,210 | 11/1993 | McClure | 365/218 |
| 5,293,623 | 3/1994 | Froniewski et al. | 365/425 |
| 5,296,766 | 3/1994 | Masaki | 327/387 |
| 5,300,828 | 4/1994 | McClure | 307/443 |
| 5,305,268 | 4/1994 | McClure | 365/203 |
| 5,311,467 | 5/1994 | Lysinger et al. | 365/189.01 |
| 5,341,341 | 8/1994 | Fukuzo | 365/233 |
| 5,402,389 | 3/1995 | Flannagan et al. | 365/233 |
| 5,493,530 | 2/1996 | Loe et al. | 365/189.05 |
| 5,519,344 | 5/1996 | Proebsting | 327/108 |
| 5,521,878 | 5/1996 | Ohtani et al. | 365/233 |
| 5,537,060 | 7/1996 | Back | 326/58 |
| 5,539,696 | 7/1996 | Patel | 365/189.01 |
| 5,546,029 | 8/1996 | Koke | 327/112 |
| 5,568,081 | 10/1996 | Lui et al. | 327/380 |
| 5,701,275 | 12/1997 | McClure | 365/233 |

*Primary Examiner*—Viet Q. Nguyen
*Attorney, Agent, or Firm*—Theodore E. Galanthay; Lisa K. Jorgenson; Renee M. Larson

[57] ABSTRACT

According to the present invention, the data access time of a chip select condition of a synchronized memory integrated circuit device is pipelined so that it approximates the normal access time of data for the device. The response time to the chip enable signal during a deselect condition is immediate and thus is not pipelined. The access time of data due to a chip select condition is pipelined and matched with the normal access time of data propagation so that any access time pushout previously incurred when transitioning the device output signal from a high impedance (disabled) to a low impedance (enabled) state is eliminated. The circuitry of the present invention tri-states the output pin of the synchronized memory device on the initial rising edge of an external clock signal supplied to the device upon a deselect condition. Upon the first cycle of the select condition, when the external clock signal initially rises, an Output Disable Internal signal remains a high logic state. Next, on the second rising edge of the external clock signal, an Output Enable Internal signal is clocked high and the Output Disable Internal signal is clocked low, thereby overcoming an weak latch on the Output Disable Internal signal to change the output pins of the device from a high impedance to a low impedance state indicative of a select condition.

22 Claims, 3 Drawing Sheets

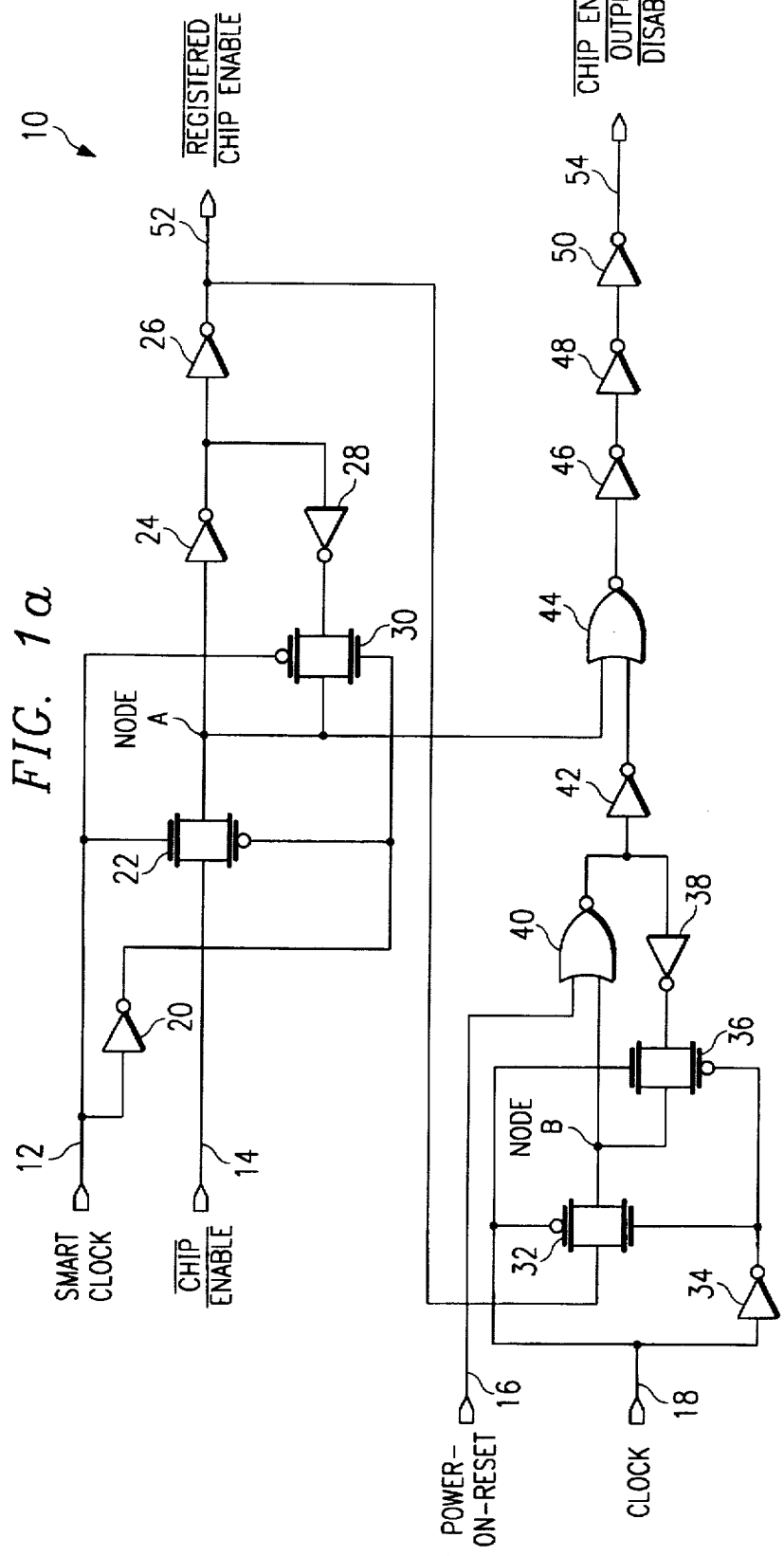
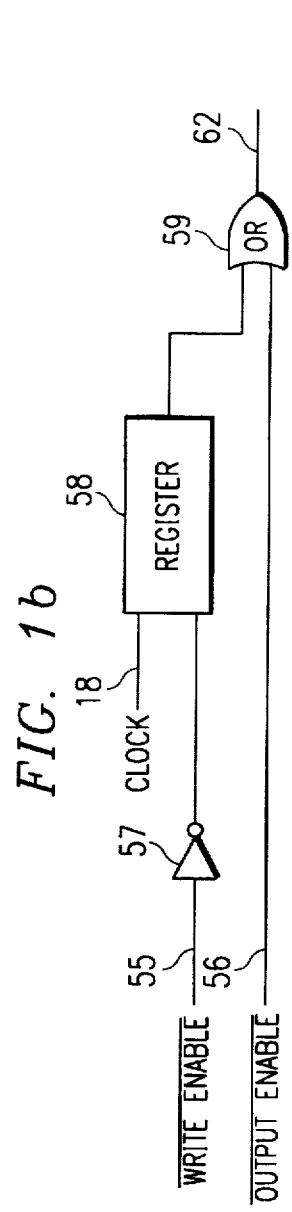

PIPELINED CHIP ENABLE CONTROL CIRCUITRY AND METHODOLOGY

This is a Division of application Ser. No. 08/588,730, filed Jan. 19, 1996, now U.S. Pat. No. 5,701,275.

CROSS REFERENCE TO RELATED APPLICATIONS

The subject matter of the present application is related to copending U.S. application Ser. No. 08/173,197, filed Dec. 22, 1993, titled "Improved Static Memory Long Write Test", Docket No. 93-C-82, copending U.S. application Ser. No. 08/172,854, filed Dec. 22, 1993, titled "Stress Test Mode", Attorney Docket No. 93-C-56, which are assigned to SGS-Thomson Microelectronics, Inc. and expressly incorporated herein by reference.

Additionally, the following pending U.S. patent applications by David Charles McClure entitled:

"Architecture Redundancy", Ser. No. 08/582,424 (Attorney's Docket No. 95-C-136), and "Redundancy Control", Ser. No. 08/580,027 (Attorney's Docket No. 95-C-143), which were both filed on Dec. 29, 1995, and have the same ownership as the present application, and to that extent are arguable related to the present application, which are herein incorporated by reference; and entitled:

"Test Mode Activation and Data Override", Ser. No. 08/587,709 (Attorney's Docket No. 95-C-137), "Pipelined Chip Enable Control Circuitry and Methodology", Ser. No. 08/588,730 (Docket No. 95-C-138), "Output Driver Ciruitry Having a Single Slew Rate Resistor", Ser. No. 08/588,988 (Docket No. 95-C-139), "Synchronized Stress Test Control", Ser. No. 08/589,015 (Docket No. 95-C-142), "Write Pass Through Circuit", Ser. No. 08/589,662 (Attorney's Docket No. 95-C-144), "Data-Input Device for Generating Test Signals on Bit and Bit-Complement Lines", Ser. No. 08/588,762 (Attorney's Docket No. 95-C-145), "Synchronous Output Circuit", Ser. No. 08/588,901 (Attorney's Docket No. 95-C-146), "Write Driver Having a Test Function", Ser. No. 08/589,141 (Attorney's Docket No. 95-C-147), "Circuit and Method for Tracking the Start of a Write to a Memory Cell", Ser. No. 08/589,139 (Attorney's Docket No. 95-C-148), "Circuit and Method for Terminating a Write to a Memory Cell", Ser. No. 08/588,737 (Attorney's Docket No. 95-C-149), "Clocked Sense Amplifier with Wordline Tracking", Ser. No. 08/587,728 Attorney's Docket No. 95-C-150), "Memory-Row Selector Having a Test Function", Ser. No. 08/589,140 (Attorney's Docket No. 95-C-151), "Synchronous Test Mode Initialization", Ser. No. 08/588,729 (Docket No. 95-C-153), "Device and Method for Isolating Bit Lines from a Data Line", Ser. No. 08/588,740 (Attorney's Docket No. 95-C-154), "Circuit and Method for Setting the Time Duration of a Write to a Memory Cell", Ser. No. 08/587,711 (Attorney's Docket No. 95-C-156), "Low-Power Reading Circuit and Method for Controlling A Sense Amplifier", Ser. No. 08/589,024 (Attorney's Docket No. 95-C-168), "Device and Method for Driving a Conductive Path with a Signal", Ser. No. 08/587,708 (Attorney's Docket No. 169), and the following pending U.S. Patent Applications by Mark A. Lysinger entitled:

"Burst Counter Circuit and Method of Operation Thereof", Ser. No. 08/589,023 (Attorney's Docket No. 95-C-141), "Controller for Burst Counter Circuit", Ser. No. 08/588,648 (Attorney's Docket No. 96-C-03), which have the same effective filing data and ownership as the present application, and to that extent are arguably related to the present application, are incorporated herein by reference.

BACKGROUND OF THE INVENTION

The present invention relates generally to integrated circuit devices, and more specifically to integrated circuit synchronous memory devices.

In modern integrated circuit synchronous memory devices, it is common to use pipeline techniques to speed up the access time of certain signals. For instance, data access is commonly pipelined so that it may be accessed very quickly. In a pipelined synchronous memory device, such as a SRAM (static random access memory) or BRAM (burst random access memory), data is pipelined so it is effectively present at the output register ready and waiting to be clocked out as needed. Thus, in a synchronous memory device data access can occur very quickly, i.e. approximately 3 nS for a fast SRAM or BRAM.

While data access is pipelined and thus very fast, other non-pipelined access paths are not as fast and thereby slow down the operation of the integrated circuit synchronous memory device when it becomes necessary to wait for slower access cycles to be completed. Synchronous memory devices, for instance, commonly have a chip enable signal which controls selection/deselection of the memory device. Chip enable signal access of the synchronous memory device is not pipelined and thus much slower than data access for the same device. For instance, while data access may only require approximately 3 nS, chip enable access for the same synchronous memory device may take considerably longer, i.e. 5 nS.

Selection of a synchronous memory device by operation of its chip enable signal from a deselection condition requires that data be accessed on the first rising edge of the device clock. Data, however, is not output from the device until the second rising edge of the device clock when the output pins of the device change from a high impedance condition to a low impedance condition which enables the output pins to output the data. It is possible that before completion of the second rising edge of the device clock when the output pins are enabled, the user may no longer wish to enable the synchronous memory device and instead wish to keep it disabled. If this were to occur, the output pins of the device would need to remain high impedance so that data is not output via the device output pins. Because of this uncertainty, it is not clear whether the synchronous memory device should be selected or deselected until the state of the device's chip enable signal is allowed to propagate through the device. The time it takes the chip enable signal to propagate through the device results in an access pushout as the output pins of the device change from a high impedance condition to a low impedance condition as compared to the normal data access time. If it takes 3 nS to access data and 5 nS to access the chip enable signal, for instance, the pushout would be 2 nS.

As might be expected, the need to wait for the chip enable signal to propagate through the device necessarily slows down device operation. The fact that the access speed of the chip enable signal is slower than access speed of data further exacerbates this delay. There is thus an unmet need in the art to be able to closely match the access speed of a synchronous device chip enable signal to the access speed of data.

SUMMARY OF THE INVENTION

It is an object of the present invention to speed up the data access time upon a chip select condition of an integrated circuit synchronous memory device.

It is further an object of the present invention to speed up the access time of a chip select signal of an integrated circuit synchronous memory device so that the data access time upon a chip select condition approximates that of the normal access time of data of the integrated circuit device.

Therefore, according to the present invention, the data access time upon a chip enable select condition of a synchronized memory integrated circuit device is pipelined so that it approximates the normal access time of data for the device which is also pipelined. Allowing the state of the chip enable signal to propagate through the device eliminates any data access time pushout previously incurred when transitioning the device output signal from a high impedance (disable) to a low impedance (enable) state when the device becomes selected. A deselect condition of the synchronized memory device is not pipelined.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1 is a schematic diagram of Chip Enable Control circuitry, according to the present invention;

FIG. 1a is a schematic diagram of circuitry for generating an output disable signal, according to the present invention;

DESCRIPTION OF THE INVENTION

Figure 2:
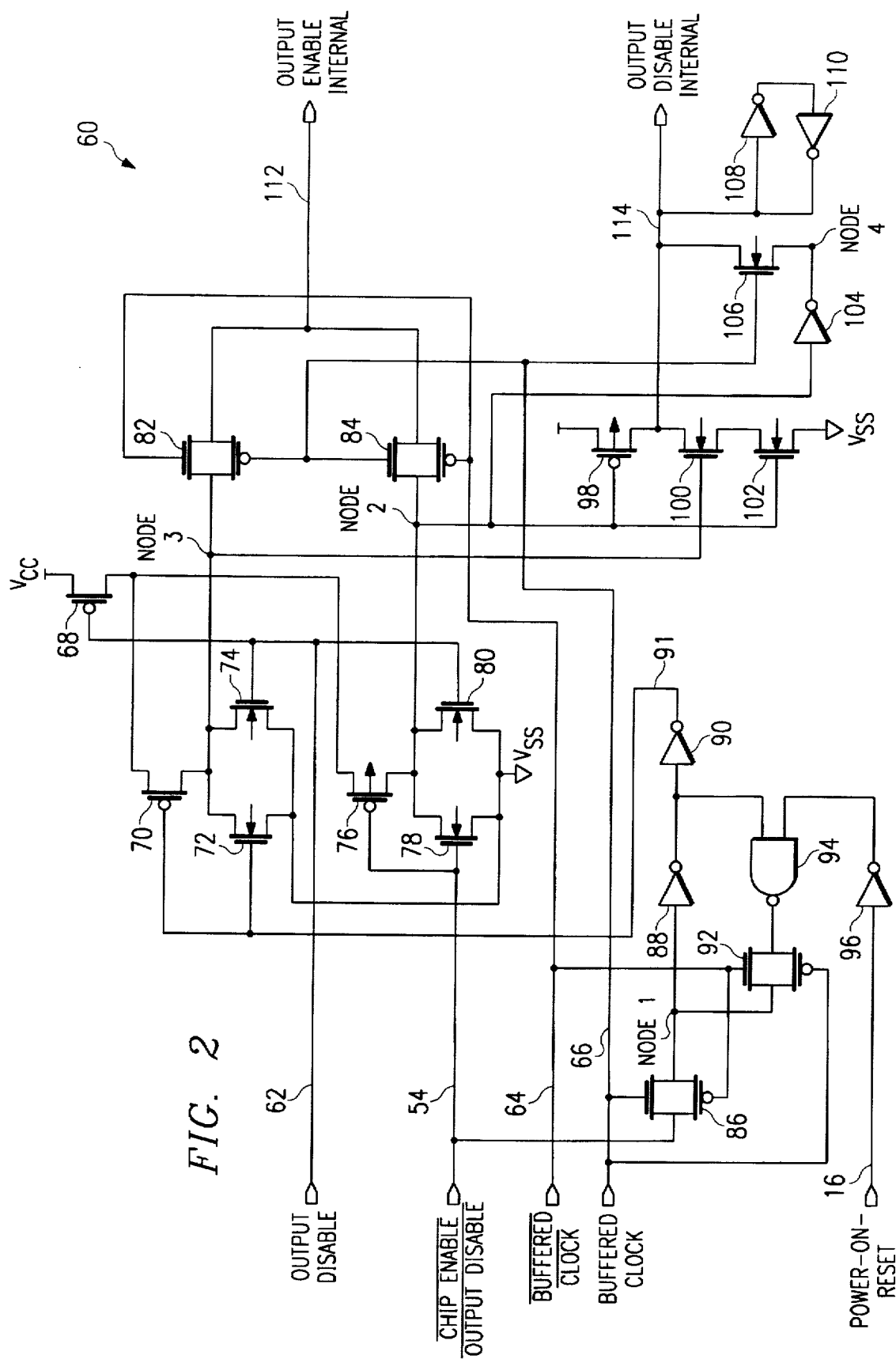
FIG. 2 is a schematic diagram of Output Driver Tri-state Control circuitry, according to the present invention.

The present invention effectively pipelines the chip enable signal for a select condition of a synchronized memory integrated circuit device so that the chip enable signal is allowed to propagate through the device. The time required for chip enable select accessing of data is thus reduced and approximates the time required for normal pipelined data access. Update upon a deselect condition, on the other hand, occurs immediately and is non-pipelined.

Referring to FIG. 1, Chip Enable Control circuit 10 is shown. The elements of Chip Enable Control circuit 10 include: inverters 20, 24, 26, 28, 34, 38, 42, 46, 48 and 50; pass gates 22, 30, 32 and 36; and NOR logic gates 40 and 44. The signals supplied to Chip Enable Control circuit 10 include Smart Clock signal 12, Chip Enable bar signal 14, Power-On-Reset signal 16 and Clock signal 18. Clock signal 18 is a clock signal external to the integrated circuit synchronized memory device or a derivative signal thereof. Smart Clock signal 12 is a high-going narrow pulse generated from the rising edge of Clock signal 18 and goes back low before Clock signal 18 changes state. Chip Enable bar signal 14 is a low true signal. Chip Enable Control circuit 10 generates Registered Chip Enable bar signal 52 and Chip Enable Output Disable bar signal 54. Registered Chip Enable bar signal 52 and Chip Enable Output Disable bar signal 54 are low true signals.

The Chip Enable Output Disable bar signal 54 is provided to and utilized by the circuitry of FIG. 2. Referring to FIG. 2, Output Driver Tri-state Control circuit 60 includes the following elements: p-channel MOS (metal oxide silicon) transistors 68, 70, 76 and 98; n-channel MOS transistors 72, 74, 78, 80, 100, 102 and 106; inverters 88, 90, 96, 104, 108 and 110; NAND logic gate 94; and passgates 82, 84, 86 and 92. The following input signals are supplied to Output Driver Tri-state Control circuit 60: Output Disable signal 62, Chip Enable Output Disable bar signal 54 generated by the circuitry of FIG. 1, Buffered Clock bar signal 64, Buffered Clock signal 66 and Power-On-Reset signal 16. Buffered Clock bar signal 64 and Buffered Clock signal 66 are buffered signals of Clock signal 18 and are inverse with respect to each other. Output Driver Tri-state Control circuit 60 generates the following output signals utilized by Output Buffer circuitry 120 of FIG. 3: Output Enable Internal signal 112 and Output Disable Internal signal 114.

Output Disable signal 62 is a function of the asynchronous Output Enable signal and the Write Enable signal of the synchronous memory device as shown in FIG. 1a. Write Enable bar signal 55 is an input signal of inverter 57. The output signal of inverter 57 and Clock signal 18 are input signals to Register 58. Output Enable bar signal 56 and the output signal of register 58 are both input signals of OR logic gate 59 which generates Output Disable 62. Output Enable bar signal 56 is an asynchronous signal, commonly referred to as "G bar" on data sheets, which controls Output Disable signal 62 to tri-state the output pins of the synchronous memory device.

Figure 3:
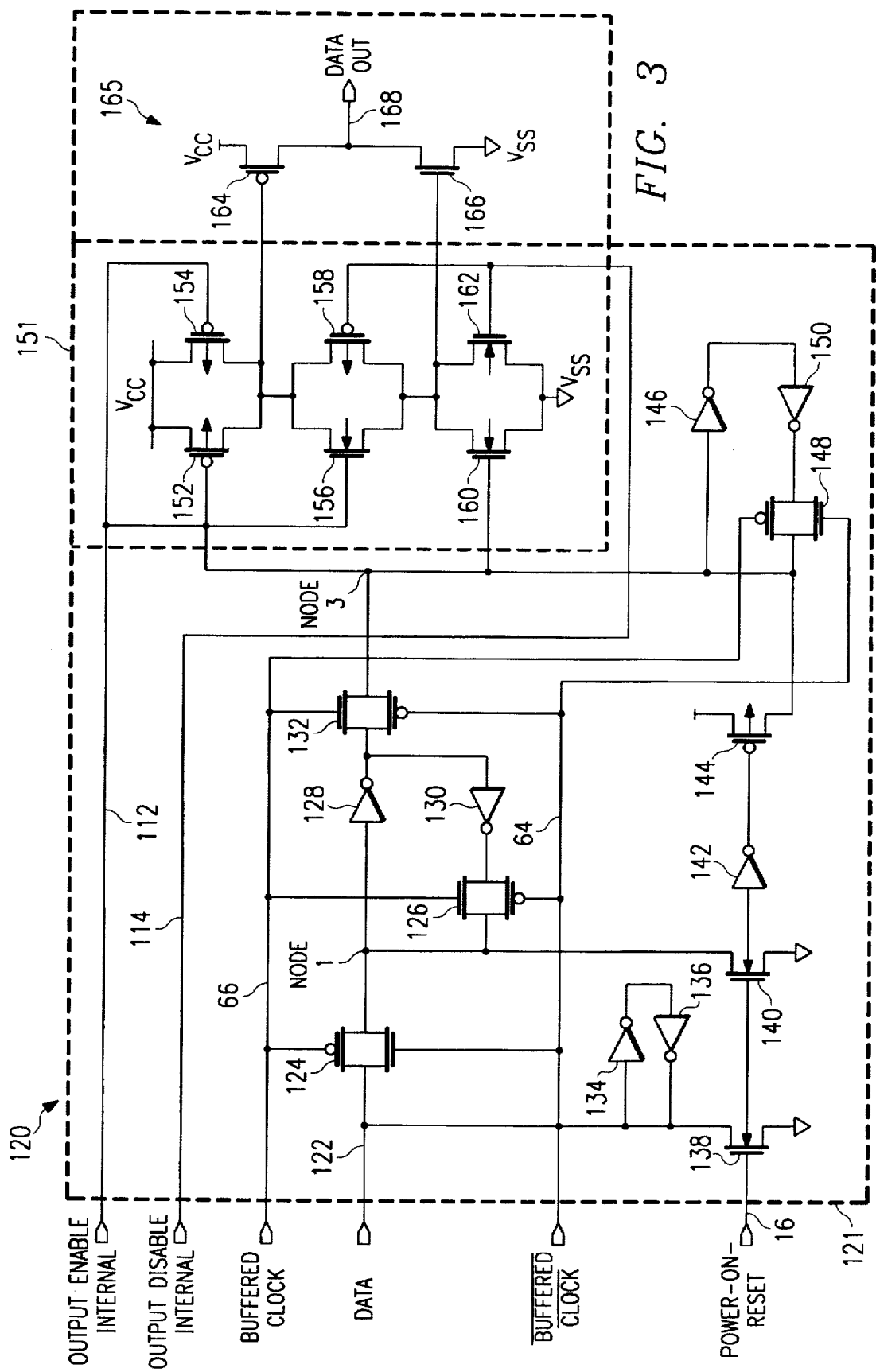
FIG. 3 is a schematic diagram of Output Buffer circuitry, according to the present invention.

Referring now to FIG. 3, Output Enable Internal signal 112 and Output Disable Internal signal 114 of FIG. 2 are supplied to control the Tri-state Control Gate circuitry 151 of Output Buffer circuitry 120. Tri-state Control gate circuitry 151 in turn drives the p-channel and n-channel output drivers of Output Driver circuitry 165. Output Buffer circuitry 120 is composed of Output Register circuitry 121, Tri-state Control circuitry 151 and Output Driver circuitry 165. Output Buffer circuitry 120 is supplied with the following input signals: Output Enable Internal signal 112 (from FIG. 2), Output Disable Internal signal 114 (from FIG. 2), Buffered Clock signal 66, Buffered Clock bar signal 64, Data signal 122 and Power-On-Reset signal 16. Output Buffer circuitry 120 is pipeline registered circuitry which generates Data Out 168 as an output signal. Upon power-up, the device is in a deselect condition and output signal 168 is connected to an output pin which is in a high impedance condition.

Output Register circuitry 121 includes the following elements: passgates 124, 126, 132 and 148; inverters 128, 130, 134, 136, 142, 146 and 150; n-channel MOS transistors 138 and 140; and p-channel MOS transistor 144. Tri-state Control circuitry 151 includes the following elements: p-channel MOS transistors 152, 154 and 158; and n-channel MOS transistors 156, 160 and 162. Output Driver circuitry 165 includes the following elements: p-channel MOS transistor 164 and n-channel MOS transistor 166.

The operation of the circuitry of FIGS. 1, 2 and 3 of the present invention will now be discussed. Referring again to FIG. 3, Output Enable Internal signal 112 and Output Disable Internal signal 114 control the tri-state control gate 151 which drives the p-channel MOS transistor 164 and n-channel MOS transistor 166 of output driver 165. Output Enable Internal signal 112 and Output Disable Internal signal 114 are controlled by Output Disable signal 62 of FIG. 2 and Chip Enable bar signal 14 of FIG. 1. A high logic state on Output Disable Internal signal 114 and a low logic state on Output Enable Internal signal 112 tri-states output driver 165.

If a device deselect condition is asserted on the rising edge of Clock signal 18, then Node A of FIG. 1 will go to a high logic state when Clock signal 18, and therefore Smart Clock signal 12 which is a pulse generated from the rising edge of Clock signal 18, goes high. This will immediately bring Chip Enable Output Disable bar signal 54 to a high logic state due to NOR gate 44 of FIG. 1 and Chip Enable Output Disable bar signal 54 feeds Output Driver Tri-state Control circuit 60 of FIG. 2. The Buffered Clock signal 66 of FIG. 2 is a derivative of Clock signal 18. A high logic state on Chip Enable Output Disable bar signal 54, indicative of a disable condition of the synchronous memory device, will cause Node 2 of FIG. 2 to go low. This logic state is transferred to Output Enable Internal signal 112 since Buffered Clock signal 66 is a high logic state, and Output Disable Internal signal 114 is pulled high, tri-stating the output pin on the initial rising edge of Clock signal 18. Node 1 of FIG. 2 also goes high as does signal 91. Thus, when Buffered Clock signal 66 goes low, Node 3 is transferred to Output Enable Internal signal 112 and will remain a low logic state; Output Disable Internal signal 114 remains high. The above description of the deselect condition illustrates that a chip enable deselect condition of the integrated circuit synchronous memory device occurs immediately.

Turning from a deselection condition to a selection condition, selection of the synchronous memory device by operation of its chip enable signal from a deselection condition requires that data be accessed from the memory array and stored into the output register of the synchronous memory device on the first rising edge of the device clock. Data is not output from the device until the second rising edge of the device clock when the output pins of the device change from a high impedance condition to a low impedance condition which enables the output pins to output the data. It is possible that before completion of the second rising edge of the device clock when the output pins are enabled, the user may no longer wish to enable the synchronous memory device and instead wish to keep it disabled. If this were to occur, the output pins of the device would need to remain high impedance so that data is not output via the device output pins. Because of this uncertainty, it is not clear whether the synchronous memory device should be selected or deselected until the state of the device's chip enable signal is allowed to propagate through the device. In the prior art, the time it takes the chip enable signal to propagate through the device results in an access pushout as the output pins of the device change from a high impedance condition to a low impedance condition as compared to the normal data access time. The present invention allows the chip enable signal to propagate through the device in anticipation of a chip select condition.

On the first cycle of a chip enable select condition, when Clock signal 18 initially rises, Node A in FIG. 1 is clocked in as a low logic state since Chip Enable bar signal 14 is low. This low logic state propagates to Registered Chip Enable bar signal 52. When Clock signal 18 goes to a low logic state, Node B and Chip Enable Output Disable bar signal 54 go to a low logic state. This is turn causes Node 2 of FIG. 2 to go to a high logic state which turns off p-channel MOS transistor 98 and Node 4 of FIG. 2 goes to a low logic state. The latch composed of inverters 108 and 110 of FIG. 2 keeps Output Disable Internal signal 114 at a high logic state. Signal 91 is still a high logic state and Node 3 is a low logic state. Passgate 82 is on so that Output Enable Internal signal 112 is still a low logic state.

Next, on the second rising edge of Clock signal 18, Buffered Clock signal 66 goes to a high logic state, clocking Output Enable Internal signal 112 high via passgate 84 and clocking Output Disable Internal signal 114 low via n-channel MOS transistor 106, thereby overcoming the weak latch on Output Disable Internal signal 114. Node 1 of FIG. 2 goes low as does signal 91 and Node 3 will be a high logic state, ready if Buffered Clock signal 66 goes to a low logic state to maintain Output Enable Internal signal 112 at a high logic state.

As previously discussed, Output Disable signal 62 is an asynchronous signal. Therefore, regardless of the state of Buffered Clock signal 66, if Output Disable signal 62 is a high logic state then Node 2 and Node 3 of FIG. 2 are both a low logic state so that Output Enable Internal signal 112 is a low logic state and Output Disable Internal signal 114 is a high output logic state indicative of a deselect condition. On the other hand, if Output Disable signal 62 is high during the second rising edge of Buffered Clock signal 66 to enable or select the device but then goes low when Buffered Clock signal 66 goes low, the output signal Data Out 168 of the device should still go to a low impedance indicative of a select condition. Node 3 of FIG. 2 will then go high, bringing Output Enable Internal to a high logic state, and n-channel MOS transistors 100 and 102 will pull Output Disable Internal signal 114 to a low logic state.

Both Data signal 122 and Chip Enable bar signal 14 are each just one passgate away from tri-state control gate 151. Chip Enable bar signal 14 is just one passgate (passgates 82, 84 and transistor 106) away from tri-state control circuitry 151. Likewise, Data signal 122 is just one passgate (passgate 132) away from tri-state control circuitry 151. Data signal 122 has propagated to the output of inverter 128 until passgate 132 is clocked by Buffered Clock signal 66 before it goes to tri-state control circuitry 151. Thus, the data access time is equal to the data access time due to the chip select condition.

The present invention uses pipeline technology to effectively speed up the access time required for a chip enable select/deselect to the access time required for data of a synchronized memory integrated circuit device. The chip enable condition requires two clock cycles and on the second clock cycle, data may be clocked out. The chip enable condition is pipelined so that it is effectively waiting at the Output Buffer circuitry 120 of FIG. 3 should the device be chosen to be selected. Allowing the state of the chip enable signal to propagate through the device eliminates any access time pushout previously incurred in transitioning the device output pins from a high impedance (disabled) to a low impedance (enabled) state. Update of a chip disable condition happens immediately on the initial clock cycle of Clock signal 18.

While the invention has been particularly shown and described with reference to a preferred embodiment, it will be understood by those skilled in the art that various changes in form and detail may be made therein without departing from the spirit and scope of the invention.

What is claimed is:

1. A method for pipelined chip enable control of a synchronous memory device, comprising the steps of:

during a rising edge of an initial cycle of a clock signal, before which the synchronous memory device is in a deselect condition, registering the state of a chip enable signal of the synchronous memory device;

during a falling edge of the initial cycle of the clock signal, updating a chip enable output disable signal to a first logic state and maintaining a logic state of an internal tri-state control signal; and during a rising edge of a subsequent cycle of the clock signal, clocking in the first logic state of the chip enable output disable signal to the internal tri-state control signal, thereby defining a select condition in which the synchronous memory device is selected and transitions from the deselect condition to the select condition and a plurality of output pins of the synchronous memory device are enabled.

2. The method of claim 1, wherein the plurality of output pins of the synchronous memory device are in a low impedance condition when enabled.

3. The method of claim 1, wherein if the synchronous memory device is selected and a second logic state of the chip enable output disable signal is asserted during a cycle of the clock signal, then the second logic state of the chip enable output disable signal is registered and the internal tri-state control signal is updated during the cycle of the clock signal and the synchronous memory device transitions from the select condition to the deselect condition.

4. The method of claim 3, wherein the cycle of the clock signal immediately follows the subsequent cycle of the clock signal.

5. The method of claim 3, wherein the chip enable output disable signal is asserted, the second logic state of the chip enable output disable signal is registered and the internal tri-state control signal is updated during a rising edge of the cycle of the clock signal.

6. The method of claim 3, wherein during the deselect condition the plurality of output pins are in a high impedance condition and data may not be output to the plurality of output pins.

7. A method for pipelined chip enable control of a synchronous memory device, comprising the steps of:

during a rising edge of an initial cycle of a clock signal, before which the synchronous memory device is in a deselect condition, registering the state of a chip enable signal of the synchronous memory device;

during a falling edge of the initial cycle of the clock signal, updating a chip enable output disable signal to a first logic state and maintaining an internal output disable signal at a second logic state and an internal output enable signal at a first logic state; and during a rising edge of a subsequent cycle of the clock signal, clocking in the first logic state of the chip enable output disable signal to the internal output disable signal and clocking the second logic state to the internal output enable signal, thereby defining a select condition in which the synchronous memory device is selected and transistions from the deselect condition to the select condition and a plurality of output pins of the synchronous memory device are enabled.

8. The method of claim 7, wherein during the falling edge of the initial cycle of the clock signal, the internal output disable signal is maintained at the second logic state by a latch.

9. The method of claim 8, wherein during the rising edge of the subsequent cycle of the clock signal when the internal output disable signal is clocked to the first logic state, the latch is no longer able to maintain the internal output disable signal at the second logic state.

10. The method of claim 8, wherein during the initial cycle of the clock signal the plurality of output pins of the synchronous memory device are in a high impedance state and disabled.

11. The method of claim 9, wherein the first logic state is a low logic state and the second logic state is a high logic state.

12. The method of claim 7, wherein the subsequent cycle of the clock signal is a second cycle of the clock signal immediately following the initial cycle of the cock signal.

13. The method of claim 7, wherein during the rising edge of the subsequent cycle of the clock signal, the internal output enable signal is clocked high by a passgate element.

14. The method of claim 7, wherein during the select condition the plurality of output pins of the synchronous memory device are enabled by switching the plurality of output pins from a high impedance condition to a low impedance condition.

15. The method of claim 14, wherein during the select condition data may be output to the plurality of output pins.

16. The method of claim 7, wherein if an output disable control signal is equal to the second logic state a deselect condition of the synchronized memory device is defined and the synchronized memory device transitions from a select condition to a deselect condition.

17. The method of claim 16, wherein the output disable control signal is a derivative signal of an asynchronous signal and a synchronous signal.

18. The method of claim 17, wherein the asynchronous signal is an output enable signal and the synchronous signal is a write enable signal.

19. The method of claim 16, wherein if the output disable control signal is equal to the second logic state, the internal output enable signal is equal to the first logic state and the internal output disable signal is equal to the second logic state indicative of the deselect condition.

20. The method of claim 19, wherein the plurality of output pins of the synchronous memory device are tri-stated and therefore disabled.

21. The method of claim 19, wherein during the deselect condition the plurality of output pins are in a high impedance condition and data may not be output to the plurality of output pins.

22. The method of claim 16, wherein the deselect condition is immediately reflected in the plurality of output pins of the synchronous memory device on the initial cycle of the clock signal.

* * * * *